USO05611899A

United States Patent [19]

Maass

[11] Patent Number: 5,611,899
[45] Date of Patent: Mar. 18, 1997

[54] DEVICE FOR SUPPRESSING FLASHOVERS IN CATHODE SPUTTERING INSTALLATIONS

[75] Inventor: Wolfram Maass, Erlensee, Germany

[73] Assignee: Leybold Aktiengesellschaft, Hanau, Germany

[21] Appl. No.: 560,845

[22] Filed: Nov. 20, 1995

[30] Foreign Application Priority Data

Nov. 19, 1994 [DE] Germany .................. 44 41 206.1

[51] Int. Cl.$^6$ .................................................. C23C 14/54
[52] U.S. Cl. ................... 204/298.08; 204/298.03; 204/298.06; 204/298.14; 204/298.26
[58] Field of Search .................. 204/298.03, 298.06, 204/298.08, 298.26, 298.32, 192.12, 298.14

[56] References Cited

U.S. PATENT DOCUMENTS

| 4,931,169 | 6/1990 | Scherer et al. | 204/298.11 |
| 5,192,894 | 3/1993 | Teschner | 315/111.21 |
| 5,241,152 | 8/1993 | Anderson et al. | 204/298.08 |
| 5,281,321 | 1/1994 | Stürmer et al. | 204/298.08 |
| 5,286,360 | 2/1994 | Szczyrbowski et al. | 204/298.08 |
| 5,415,757 | 5/1995 | Szcyrbowski et al. | 204/298.08 |

FOREIGN PATENT DOCUMENTS

| 3121389 | 8/1982 | Germany | 204/298.08 |
| 4010495 | 10/1991 | Germany . | |
| 4230779 | 3/1994 | Germany . | |
| 4239218 | 5/1994 | Germany . | |
| 4242633 | 6/1994 | Germany . | |
| 57-69324 | 4/1982 | Japan | 204/298.03 |
| 60-70174 | 4/1985 | Japan | 204/298.08 |

OTHER PUBLICATIONS

Eliasson et al., "Ozone synthesis from oxygen in dielectric barrier discharges", J. Phys. D.: Appl. Phys. 20(1987) 1421–1437.

Eliasson et al., "Nonequilibrium Volume Plasma Chemical Processing" IEEE Transactions on Plasma Science, vol. 19, No. 6 (Dec. 1991) 1063–77.

Primary Examiner—R. Bruce Breneman
Assistant Examiner—Rodney G. McDonald
Attorney, Agent, or Firm—Felfe & Lynch

[57] ABSTRACT

An AC voltage source connected to at least one cathode is switched off rapidly upon the occurrence of a critical number of so-called "microarcs" which precede a "large arc". In order to be able to differentiate between large arcs and microarcs, a special counting and evaluation device is provided.

18 Claims, 2 Drawing Sheets

DEVICE FOR SUPPRESSING FLASHOVERS IN CATHODE SPUTTERING INSTALLATIONS

BACKGROUND OF THE INVENTION

The invention relates to a device for suppressing arcing in cathode sputtering installations in which at least one electrode is connected to an AC voltage source.

In cathode sputtering for the purpose of producing thin layers with the aid of medium-frequency techniques in which work takes place in a frequency range of a few hundred Hz to a few hundred kHz, arc discharges can be generated which can damage or destroy the layers to be produced as well as also the targets used in sputtering. This applies especially to the production of dielectric layers by means of reactive gas techniques in which into the receptacle a reactive gas is introduced with which the sputtered target material can react on the substrate. For example, to sputtered aluminum is added $O_2$ as the reactive gas in order to produce a thin layer of $Al_2O_3$.

Numerous devices have already been suggested with which it is possible to recognize arc discharges, to interrupt them or even to prevent their generation (German Patent Applications 42 30 779, 42 39 218, 42 42 633, and U.S. Pat. Nos. 4,931,169, 5,192,894, 5,281,321, 5,286,360, and 5,415,757. However, these devices are either not suitable for use in installations operating with AC voltages or they are not suited for recognizing and suppressing flashovers in the "germination phase", i.e. micro-flashovers or microarcs.

Micro-flashovers or microarcs which can be observed with an oscilloscope occur only over a halfwave or over a few halfwaves of the applied AC voltage. At an AC voltage frequency of 40 kHz this means that the arcs occur only for approximately 12.5 μs or a multiple thereof. In particular with readily melting sputtering targets, such as for example Al, these microarcs lead to damage of the layer to be produced, since the energy present in the microarcs is already sufficient to melt droplets having a diameter of a few μm off the target material and to sputter them onto the substrate. As a rule, the longer the duration of the microarc the more severe the damage.

Micro-discharges occur also as silent discharges in dielectrics and, specifically, in irregular sequences and with a duration in the range of nanoseconds. Their distribution in terms of space and time is statistical. Each micro-discharge comprises a thin nearly cylindrical canal with a pinched electrode spot on the metal electrode (B. Eliasson, M. Hirth and U. Kogelschatz: Ozone synthesis from oxygen in dielectric barrier discharges, J. Phys. D.: Appl. Phys. 20 (1987) 1421–1437). The silent discharge is preferably used in plasma chemistry to produce, for example, ozone (B. Eliasson, U. Kogelschatz: Nonequilibrium Volume Plasma Chemical Processing, IEEE Transactions on Plasma Science, Vol. 19, No. 6, 1991, pp. 1063–1077). The micro-discharges according to the invention, however, refer to discharges in plasmas.

Microarcs are typical for medium-frequency sputtering and, as a rule, represent precursor stages of large arcs. But this does not mean that every microarc must by necessity lead to a large arc. Depending on the target state, microarcs occur with greater or lesser frequency and it is not possible to even detect these microarcs with conventional methods.

A device for detecting micro-flashovers or microarcs has already been suggested, which comprises a counter for microarcs (non-published German Patent Application P 44 20 951.7). In this device a substrate to be coated is disposed opposing at least one sputtering cathode and one electrode is provided with a target. This electrode is connected to a medium-frequency source. By means of a device for recognizing micro-flashovers these micro-flashovers are detected and counted in a counting device. In the presence of a given number of micro-flashovers or in the presence of a given frequency of micro-flashovers, measures are taken to prevent large flashovers.

SUMMARY OF THE INVENTION

The present invention addresses the problem of being able to rapidly switch off the sputtering process after a critical number of microarcs has been detected.

This is done by detecting and counting the number of microarcs and taking measures to prevent large arcs after a given number of microarcs or in the presence of a given frequency of microarcs.

The advantage achieved with the invention resides especially therein that the medium-frequency (200 Hz–300 kHz) transmitter used in the sputtering installation can be rapidly switched off upon the occurrence of a critical number of microarcs, and, as a function of the configuration of the device, it is defined whether and how long the medium-frequency transmitter remains switched off in order to attain effective suppression of the arc sequences. Medium-frequency sputtering installations can be provided with a single sputtering cathode as well as also with a double cathode configuration. Consequently, the invention is suitable for both cathode configurations.

BRIEF DESCRIPTION OF THE PREFERRED EMBODIMENTS

Figure 1:
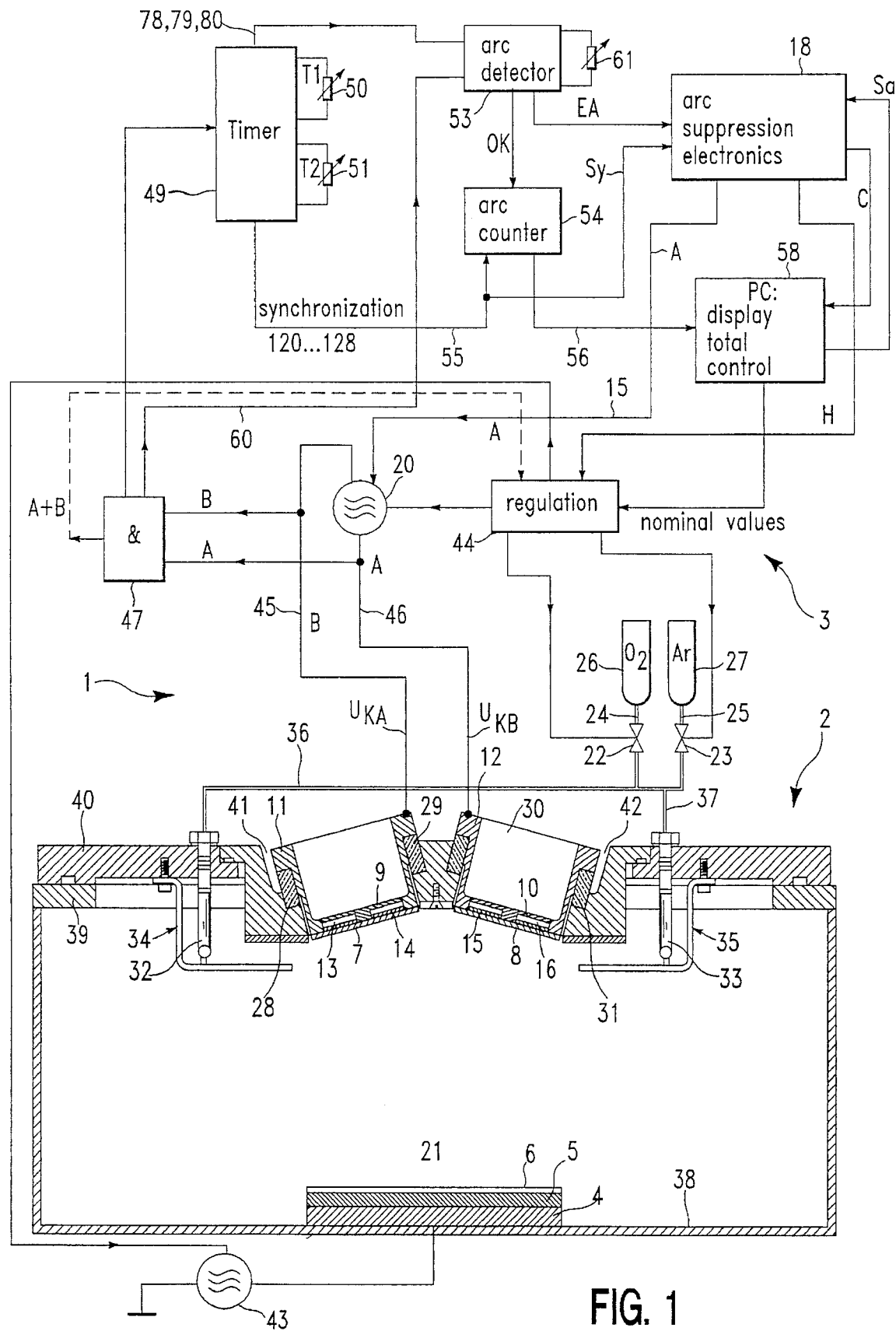
FIG. 1 a sputtering installation with a device for recognizing and suppressing flashovers, FIG. 2 a block circuit diagram representing a circuit configuration for suppressing flashovers.

In FIG. 1 is shown a sputtering installation 1 with the capability of recognizing and counting small arc flashovers at cathodes as well as, if necessary, of switching off the installation on the basis of the detected arc flashovers. The switching-off takes place thereby that a medium-frequency generator 20 is stopped.

The installation 1 depicted in FIG. 1 comprises essentially a vacuum chamber 2 and wiring electronics 3. At the bottom of the vacuum chamber 2 is provided an electrode 4 on which is disposed a substrate 5 which is to be provided with a thin layer 6. In the upper region of the vacuum chamber 2 this substrate 5 is opposedby two targets 7, 8 which are implemented as longitudinal rectangles and which are to be sputtered. Both targets 7, 8 are connected across a target holding plate 9, 10 having a U-shaped cross section, with an electrode 11, 12. These electrodes 11, 12 can be part of a magnetron which, however, is not shown in FIG. 1. Between targets 7, 8 and the target holding plates 9, 10 are provided cooling channels 13 to 16.

Similarly to a conventional DC voltage sputtering installation, in which the negative DC voltage potential at the cathode accelerates positive ions directly in the direction toward the targets, in the installation 1 shown in FIG. 1 a voltage is present at the electrodes 11, 12 which is supplied from a medium-frequency source or a medium-frequency transmitter 20. The polarity of the voltage alternates continuously such that one of the electrodes is the cathode while the other is the anode and conversely. On the basis of this medium-frequency voltage, of, for example, 40 kHz, in front of the targets 7, 8 a plasma is generated out of which particles, for example argon ions, are accelerated toward the targets 7, 8 and there eject particles which, in turn, due to their kinetic energy travel in the direction toward the substrate 5 and are deposited there as layer 6.

For the control of the installation 1 depicted, a process computer 58 is provided which processes the measured data and outputs control commands. To this process computer 58, whose regulation section 44 is depicted separately and, are supplied, for example, the values of the partial pressure measured in the process chamber. On the basis of these and other data, the process computer 58 can, for example, regulate the gas flow through valves 22, 23 disposed in gas feed lines 24, 25 which are connected with gas tanks 26, 27.

Electrodes 11, 12 are supported on insulators 28, 29 or 30, 31 such that their planar target faces are disposed obliquely with respect to the surface of the substrate 5. These insulators 28, 29 or 30, 31 have the form of rectangular frames. An installation with two electrodes, built similarly to the installation shown in FIG. 1, is known from DE-A-40 10 495 to which reference is made with respect to further details.

The gas feed lines 24, 25 lead across further gas lines 36, 37 to gas ports 32, 33 encompassed by shieldings 34, 35. Substrate 5 is disposed so as to be insulated at the bottom 38 of a vessel 39. This vessel 39 is closed with a cover 40 which has two depressions 41, 42 in its center, in which are disposed the electrodes 11, 12.

While the two electrodes 11, 12 are connected with the medium-frequency transmitter 20, the substrate 5 is connected across the electrode 4 to a voltage source 43 which, in turn, is connected to the regulation 44. The voltage source 43 is provided for the necessary electrical bias of substrate 5, i.e. the substrate 5 is intended to be at a defined electric potential. As the voltage source 43 a high-frequency voltage source is often used in order to alter the properties of the generated layers. However, in the present case it is insignificant that the voltage source 43 is a high-frequency voltage source.

The regulation 44 controls the gas valves 22, 23 and the voltage sources 20 and 43. It is impressed with the value of the mean cathode voltage, with nominal values from the computer 58 and with signals from an arc suppression electronics 18. The two outputs 45, 46 of the medium-frequency transmitter 20, which outputs, for example, an AC voltage with a frequency of 40 kHz, are free of DC voltage potential and symmetrical with respect to one another so that the cathodes are 180° out of phase. In addition to being connected with electrodes 11, 12, they are also connected to a voltage addition element 47 which transfers the sum volts, transformed down to a few voltages, of both electrodes 11, 12 to a timing unit or timer 49. The sum voltage A+B averaged over time is supplied to the regulation 44 which evaluates it for the purpose of regulation. The timer 49 uses the leading edges of the electrode voltage A+B as the criterion for the synchronization of the remaining electronic devices. The synchronization lines 120 ... 128, 55 in FIG. 1 are carried to an arc counter 54 and to the arc suppression electronics 18. At timer 49 the different times $T_1$, $T_2$ can be set as is indicated through regulatable resistors 50, 51. With times $T_1$, $T_2$ the position and length of a measuring window are set, which is used in the arc detector 53. The output of timer 49 is therefore connected with the input of the arc detector 53 across lines 78, 79, 80 which are here only depicted as one line. The sensitivity of the arc detector is defined, on the one hand, by the measuring window. It can additionally be set through a voltage trigger indicated by a regulatable resistor 61.

In the adder 47 the two voltages present on lines 45, 46 are added dynamically and simultaneously transformed down to a level of a few volts. By dynamic addition is understood that (A+B) (t)=A (t)+B (t) is determined, i.e. that no mean values are formed as is the case for the regulation 44. The signal (A+B) (t) is used for detecting the microarcs by the arc detector 53 for the purpose of which line 60 leads from the adder 47 to the arc detector 53.

The arc detector, in turn, is connected with an arc counter 54. The arc counter 54 can be realized through a microprocessor driven by a special program. From the arc counter 54 a line 56 leads to computer 58. On this line 56 is present the analog signal U=2 log (N+1). N is the number of microarcs per second.

Of special significance for the present invention is the arc suppression electronics 18. It is impressed with a synchronization signal Sy from timer 49, with a signal EA from arc detector 53, and with a signal Sa from computer 58.

The arc suppression electronics 18, in turn, outputs a signal H to the regulation 44, a signal C to the computer 58, and a signal A to the medium-frequency transmitter 20. This transmitter 20 must be a transmitter which can be switched off rapidly such as is distributed with the designation PE 5000 by Advanced Energy Industries, Inc., Fort Collins, Colo. 80525.

With the aid of the arc suppression electronics 18 the medium-frequency transmitter 20 is switched off upon the occurrence of an impermissibly large number of microarcs. The duration of the transmitter switching is defined by special measures, as will be explained in further detail in connection with FIG. 2.

Figure 2:
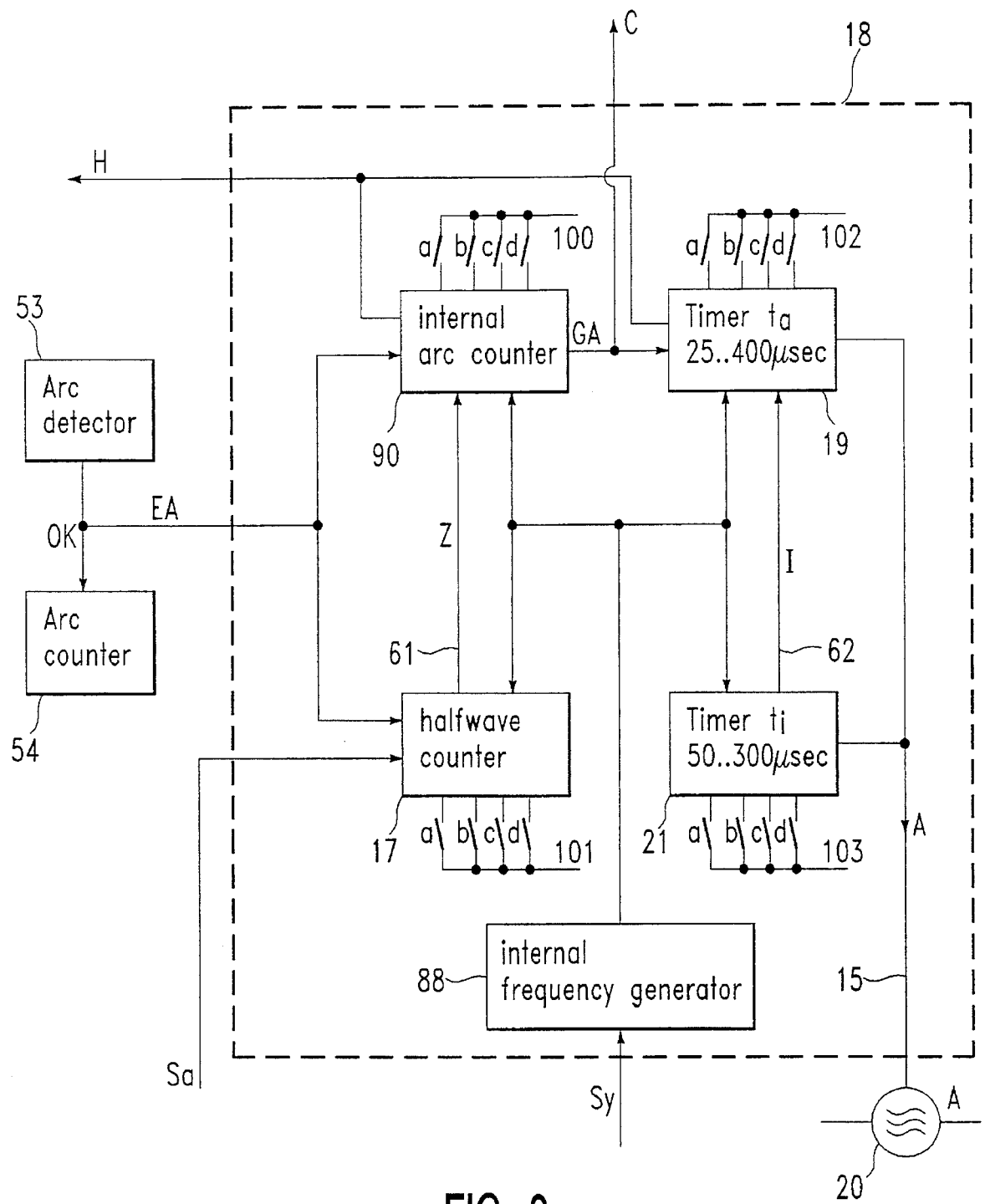

In FIG. 2 the arc suppression electronics 18 is depicted in further detail. It can be seen that it comprises essentially an "internal arc counter" 90, a halfwave counter 17, a first timer 19, a second timer 21 as well as an internal frequency generator 88.

The arc detector 53 has the capability of detecting discrete microarcs. To this end, in the case of a 40 kHz transmitter 20 in a time raster of 12.5 µs in a measuring window the voltage course is measured alternatingly at both electrodes 11, 12 of the double cathode configuration. The voltage is supplied from the adder 47 across line 60 to the arc detector 53. If the voltage breaks down within the measuring window, i.e. if the voltage falls below a trigger value, this event is defined as a microarc. A large arc is preceded by voltage drops below a given value. These drops are detected, for example, at a cathode in the form of a series of microarcs. In contrast to a discrete microarc, which is automatically extinguished again after 12.5 µs, a large arc means that a shortcircuit continues and that for this reason a voltage is no longer present at the particular cathode. Details in this connection are explained in Patent Application P 44 20 951.7.

If a discrete microarc has been detected by the arc detector 53, a signal EA is sent in this case to the halfwave counter 17 as well as also to the internal arc counter 90 which are thereby initialized. The halfwave counter 17 thereupon counts h discrete halfwaves which defines a time ΔT in units of 12.5 µs. During this time the signal Z is present at line 61 which leads to the internal arc counter 90. The internal arc counter 90 is switched into an active state through the signal Z. The occurrence of a threshold number n of microarcs during the time interval ΔT represents the beginning of a large arc. The values for ΔT and n to be set are based on experience.

The relationship between the number h of the halfwaves and the number n of the microarcs can be established, for example, with the following table.

| i = exponent or power | | 1 | 2 | 3 | 4 |
|---|---|---|---|---|---|
| h = number of halfwaves equal to $2^{(i)} - 1$ | 101 | 1 | 3 | 7 | 15 |
| n = number of microarcs equal to $2^{(i-1)}$ | 100 | 1 | 2 | 4 | 8 |

The reference numbers 101, 100 in the Table refer to cascades with the aid of which the different halfwave numbers and microarc numbers can be set. Other combinations of h and n, n≦h can be set at the switch cascades 100, 101. For the sake of simplicity, however, in the following reference is made to the above table.

The combinations of n and h entered in the table are to be interpreted as follows:

| | |
|---|---|
| i = 1 | this is the simplest case, in which every arc is simultaneously also viewed as a large arc (GA) |
| i = 2 | if in three successive halfwaves two microarcs occur, this is seen as a GA and specifically even if these two arcs are only detected at one cathode |
| i = 3 | in seven successive halfwaves at least four discrete events must be registered by the arc detector 53. These discrete events can all occur on a single electrode 11 or 12 |
| i = 4 | in fifteen successive halfwaves at least eight discrete events must be registered by the arc detector 53 for the signal GA to be triggered. |

These discrete events can all occur on a single cathode

In principle it is also possible to detect whether microarcs or large arcs occur only at one of the cathodes.

Both counters 17, 90 are impressed with the same synchronization signal Sy in order to ensure correct counting of the microarcs and the individual times ΔT, $t_a$, $t_i$.

If in the given time ΔT at least n≦h microarcs occur, the signal GA is activated by the arc counter 90, which represents a "large arc", and output to timer 19. Hereupon timer 19 outputs for a given length of time a switch-off signal A to line 15 which switches off transmitter 20. Line 15 can be a fiber optic line. The switch-off time $t_a$ is between 25 and 400 μs.

After the transmitter 20 has been switched off, the process requires a specific length of time during the subsequent driving-up of the power in order to return to the normal state. Based on experiences, this length of time has been determined to be approximately 150 μs. The values of the voltage below a given value registered necessarily during this time by the arc detector 53 must be ignored in the arc detector 53. This state 'ignore' is conveyed to the timer 19 with the aid of signal I across line 62. Time $t_i$ for the state "ignore" is determined by timer 21. For this purpose, at the time at which the transmitter 20 is switched on again, thus at the end of $t_a$, the second timer 21 is activated for time $t_i$ which, at a transmitting frequency of 40 kHz, can be between 50 and 300 μs. Simultaneously, on line 62 signal I is set which represents "ignore". During this time $t_i$ the timer 19 ignores the potentially arriving signals GA so that these signals do not again lead to a new transmitter switch-off.

The cooperation of the two timers 19, 21 and their reaction to the signal GA are consequently of great importance for the switch-off processes and for the switching on of the medium-frequency transmitter 20.

In the described embodiment example timers 19, 21 are built in the form of digital counters so that times $t_a$ and $t_i$ are obtained as integer multiples of one half or one whole fundamental period. Timers 19, 21 are therefore also provided with switch cascades 102, 103 with the aid of which times $t_a$ and $t_i$ can be suitably set. The individual switches of the cascades are denoted by a, b, d, d in all cascades. If timers 19, 21 are digital counters, the synchronization signal Sy must also be conducted to the two timers 19, 21.

Timers 19, 21 can also be constructed as analog packages. In this case, synchronization of 19, 21 is not required.

Signal GA can also be used simultaneously as counting signal C in order to count, for example, the total number of large arcs which have occurred in a given unit of time.

Signal OK in FIG. 1 and FIG. 2 is identical with signal EA in FIG. 2. The different labels are only intended to make reference to the fact that these are always signals which refer to discrete arcs [Einzel-Arcs], i.e. to microarcs, in order to differentiate them from the large arcs (GA) which, in practice, are observed as a sequence of microarcs, as was explained above in detail.

Signal H which is conducted to the regulation 44 is activated if discrete arcs occur or if during and after the transmitter switch-off times $t_a$ and $t_i$ continue. As long as H is active, all regulation circuits in regulation 44 are deactivated so that after the start-up of transmitter 20 the initial state of the process can be reached rapidly again before the switching-off.

What is claimed is:

1. Apparatus for suppressing arcs in a cathode sputtering installation having at least one cathode to which a target is mounted and at least one anode to which a substrate is mounted, said apparatus comprising an AC voltage source having an output connected to said at least one cathode, said AC voltage source having a frequency of 200 Hz to 300 kHz, microarc detection means for detecting microarcs at said at least one cathode, microarc counting means for counting the number of microarcs detected by said detection means, and means for suppressing arcs when the number of microarcs counted by said counting means exceeds a threshold.

2. Apparatus as in claim 1 wherein said arc detection means monitors the voltage on said cathode and determines that a microarc has occurred when said voltage falls below a threshold value.

3. Apparatus as in claim 1 further comprising means for determining the frequency of microarc detected by said detection means; and means for temporarily shutting off the voltage source when the frequency exceeds a threshold frequency.

4. Apparatus for suppressing arcs in a cathode sputtering installation having at least one cathode to which a target is mounted and at least one anode to which a substrate is mounted, said apparatus comprising an AC voltage source having an output connected to said at least one cathode, said output providing voltage as a series of halfwaves, halfwave counting means for counting said halfwaves, arc detection means for detecting arcs at said at least one cathode, arc counting means for counting the number of arcs detected by said detection means, means for determining the ratio of counted halfwaves to counted arcs, and switch off means for switching off the connection between the AC voltage source and the cathode means for a switch off time $t_a$ when said ratio reaches a threshold ratio.

5. Apparatus as in claim 4 wherein said time $t_a$ is between 25 and 400 µs.

6. Apparatus as in claim 4 wherein said halfwave counting means and said arc counting means are synchronized to the frequency of the AC voltage source.

7. Apparatus as in claim 4 further comprising deactivating means for deactivating the switch off means for a deactivation time $t_i$ immediately following the switch off time $t_a$.

8. Apparatus as in claim 7 wherein said time $t_i$ is between 50 and 300 µs.

9. Apparatus as in claim 7 wherein said switch off means and said deactivation means are digital counters which determine the respective times $t_a$ and $t_i$ as integer multiples of one half the fundamental period of the frequency of the AC voltage source.

10. Apparatus as in claim 9 wherein said times $t_a$ and $t_i$ are determined as integer multiples of the fundamental period of the frequency of the AC voltage source.

11. Apparatus as in claim 7 wherein said switch off means and said deactivation means are analog timers.

12. Apparatus as in claim 7 further comprising an internal frequency generator for synchronizing said halfwave counting means, said arc counting means, said switch off means, and said deactivating means.

13. Apparatus as in claim 4 further comprising a fiber optic line which provides a signal from said switch off means to said AC voltage source.

14. Apparatus as in claim 4 wherein said cathode means comprises a pair of cathodes connected to said AC voltage source so that said cathodes are 180° out of phase.

15. Apparatus as in claim 13 wherein said halfwave counting means and said arc counting means comprise means for determining whether a single arc is present over several halfwaves at either cathode.

16. Apparatus as in claim 4 wherein said halfwave counting means and said arc counting duration.

17. Apparatus as in claim 4 wherein said AC voltage source has a frequency of 200 Hz to 300 kHz.

18. Apparatus as in claim 4 wherein said arc detection means detects microarcs, said arc counting means counts microarcs detected by said arc detection means, and said means for determining the ratio of counted halfwaves to counted arcs determines the ratio of counted halfwaves to counted microarcs.

* * * * *